(12) United States Patent
Cohn

(10) Patent No.: US 6,740,222 B2
(45) Date of Patent: May 25, 2004

(54) METHOD OF MANUFACTURING A PRINTED WIRING BOARD HAVING A DISCONTINUOUS PLATING LAYER

(75) Inventor: Charles Cohn, Wayne, NJ (US)

(73) Assignee: Agere Systems Inc., Allentown, PA (US)

( * ) Notice: Subject to any disclaimer, the term of this patent is extended or adjusted under 35 U.S.C. 154(b) by 11 days.

(21) Appl. No.: 09/876,522

(22) Filed: Jun. 7, 2001

(65) Prior Publication Data

US 2002/0185311 A1 Dec. 12, 2002

(51) Int. Cl.[7] .............................. C25D 5/02; C25D 5/12
(52) U.S. Cl. .................. 205/126; 205/125; 205/170; 205/181; 205/183; 205/187; 205/220; 205/221
(58) Field of Search ............................ 205/125, 170, 205/181, 183, 184, 187, 205, 210, 220, 221, 126; 438/597, 667, 674, 678

(56) References Cited

U.S. PATENT DOCUMENTS

| | | | | | |
|---|---|---|---|---|---|
| 4,789,648 A | * | 12/1988 | Chow et al. | ................. | 438/633 |
| 4,812,213 A | * | 3/1989 | Barton et al. | ................. | 205/50 |
| 5,262,041 A | * | 11/1993 | Gulla | ......................... | 205/125 |
| 6,015,482 A | * | 1/2000 | Stern | ........................... | 205/125 |
| 6,162,365 A | * | 12/2000 | Bhatt et al. | .................... | 216/13 |
| 6,254,758 B1 | * | 7/2001 | Koyama | ..................... | 205/187 |
| 2001/0004489 A1 | * | 6/2001 | Lim | ............................ | 428/209 |

* cited by examiner

*Primary Examiner*—Nam Nguyen
*Assistant Examiner*—Brian L. Mutschler

(57) ABSTRACT

The present invention provides a method of plating an electrical contact on an integrated circuit (IC) substrate manufactured from a rigid double-sided or multi-layered printed wiring board core with dielectric layers on both sides of the core. The method may include forming electrically connected plating layers on first and second opposing sides of a substrate and electroplating a contact layer over each of the plating layers using the plating layers. The method further includes removing a portion of the plating layers from the first and second opposing sides while leaving the plating layers under the contact layer.

16 Claims, 3 Drawing Sheets

METHOD OF MANUFACTURING A PRINTED WIRING BOARD HAVING A DISCONTINUOUS PLATING LAYER

TECHNICAL FIELD OF THE INVENTION

The present invention is directed, in general, to printed wiring boards (PWBs) and, more specifically, to a printed wiring board having a discontinuous plating layer and a method of manufacture thereof.

BACKGROUND OF THE INVENTION

Substrates used in integrated circuit (IC) packages provide mechanical support for, and the electrical interconnections of, the IC to a circuit board. As such, the composition of these substrates has long been the subject of development effort in the manufacturing community. Of the available materials for use as the printed circuit core of a substrate, fiberglass/epoxy resin has emerged as the most common. Other materials, such as ceramic and copper, are also available, however they are more often directed to special uses.

Typically, the substrates used for IC packages are multi-layer, and usually formed from about four to eight different layers. As such, some or all of the multiple layers are interconnected in different areas to provide conductive pathways between the top surface of the substrate, to which an IC is mounted, to the bottom of the substrate where solder balls are attached for interconnection to a circuit board, such as a motherboard. Perhaps the most common technique for providing such interconnections on opposing sides of a substrate are conductive vias drilled through the various layers to couple together the conductive layers on both sides of the substrate. Once the interconnections are formed, contact pads may be formed over portions of the conductive layers using electroplating techniques, such as gold-over-nickel electroplating. Although electro-less techniques are also an option for depositing the gold-over-nickel over the conductive layers, reliability concerns of the resulting contact pads often lead manufacturers towards an electroplating process. For example, electro-less techniques often result in brittle, weak solder connections between the contact pads on the substrate and the contact pads on the motherboard or IC.

The conventional electroplating process uses electrical current to electrically deposit the contact layer, commonly gold over nickel, over a conductive layer typically made of copper. As such, the contact layer is electroplated only on exposed portions of the conductive layer, which provide a conduit for the electrical current. In many cases, the conductive layers are applied by a combination of electro-less and electroplating techniques, or even by the use of a thin metal layer deposited by vapor deposition techniques that runs to the outer edge of the substrate. Alternatively, the conductive layers may also be applied using electroplating techniques. Once the electroplating of the contact layers over the conductive layers has been completed, the conductive layers previously used to conduct current simply remain within the PWB's substrate. These remaining pieces are known as "plating bars" or "tie bars."

Although used extensively in the manufacturing processes found in the prior art, the presence of these plating bars presents several problems for manufacturers in the industry, as well as consumers of the finished substrate. Specifically, such plating bars, since they are not used in the finished product, occupy space that may be better filled with useful circuitry. In addition, since plating bars typically run throughout an entire substrate, these bars run to the edges of the finished substrates formed when a larger substrate is severed into individual pieces. Since these plating bars are exposed along the edges of the now-severed substrates and they extend extensively throughout the substrate, they often become antennae causing electrical interference that may affect the overall substrate performance. For example, interference caused by the plating bars may include electrical noise and cross-talk among the various conductive materials in the substrate. Such interference may become especially problematic in those substrates used in high frequency devices.

Although techniques are available to remove some of plating bars after their use in the gold-over-nickel electroplating process, these techniques typically only remove those bars located on the surface of the substrate since they are accessible from without the substrate. However, the plating bars located within the multiple layers of the substrates cannot be removed from the finished product since they have become integrated into the circuit structure of the substrates.

Accordingly, what is needed in the art is a process for constructing substrates that allows electroplating the contact layers on a substrate without leaving plating bars throughout the finished substrates.

SUMMARY OF THE INVENTION

To address the above-discussed deficiencies of the prior art, the present invention provides a method of plating an electrical contact on a substrate. In one embodiment, the method includes forming electrically connected plating layers on first and second opposing sides of a substrate. Then, the method includes electroplating a contact layer over each of the plating layers using the plating layers. The method further includes removing a portion of the plating layers from the first and second opposing sides while leaving the plating layers under the contact layer. This method can also be used to manufacture a substrate, which is yet another embodiment covered by the present invention.

In yet another aspect, the present invention provides a substrate having dielectric layers located on opposing first and second sides of a substrate and having openings formed therein. The substrate further includes a metallized via extending through the substrate and having a via metal extending therefrom where the openings contact the via metal. The substrate also has a discontinuous plating layer located within each of the openings and contacting the via metal. The substrate still further includes an electroplated contact layer located over each of the discontinuous plating layers where the electroplated contact layers are electrically connected to each other by the via metal.

The foregoing has outlined advantageous and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiments as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIG- UREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
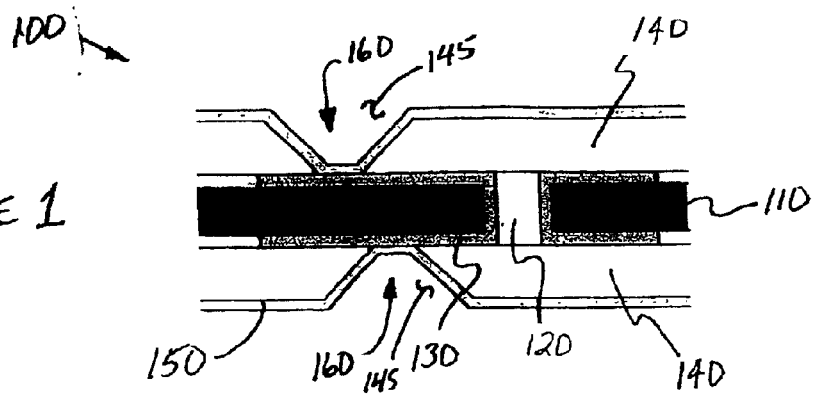
FIG. 1 illustrates a sectional view of a portion of one embodiment of an IC substrate manufactured according to the principles of the present invention.

Referring initially to FIG. 1, illustrated is a sectional view of a portion of one embodiment of an IC substrate 100 manufactured according to the principles of the present invention. FIG. 1 illustrates a sectional view of a portion of the substrate 100 early in the manufacturing process, and includes a conventional printed wiring board (PWB) 110 as its core. The PWB 110 provides structural support for the overall substrate 100 and, in exemplary embodiments, the core may be composed of Bismaleimide Triazine (BT), fiberglass, copper or other suitable, rigid material. Those skilled in the art understand the advantages associated with each of these materials, as well as other materials suitable for use as the core of the substrate 100.

The substrate 100 further includes a conventional via 120 formed through the PWB 110, which connects a first side of the substrate 100 with a second side. As is known in the art, the via 120 may be formed using a mechanical drilling process, as well as other techniques such as laser drilling. A metal interconnect 130 electrically connects the first and second sides of the substrate 100, and forms a plated-through-hole (PTH) in the via 120. A dielectric layer 140 is deposited over the first and second sides of the PWB 110, and openings 145 are conventionally formed within the dielectric layers 140 by either photo exposure, laser drilling or other suitable means. The dielectric layer 140 is patterned to form the openings 145 such that they open on the metal interconnect 130.

Also illustrated are plating layers 150 formed on the opposing sides of the substrate 100, over the dielectric layer 140 and connecting to the metal interconnect 130. As used herein, the term "plating layer" means an electrically conductive layer that may be used to conduct electrical current for an electroplating process. The plating layers 150 may be deposited by conventional methods in the openings 145 to connect with the metal interconnect 130, thereby forming contact recesses 160 on the substrate 100. At this point of manufacture, the plating layers 150 extend out to the edges of the substrate 100. By connecting with the metal interconnect 130 on both sides of the PWB 110, the plating layers 150 are electrically connected across the substrate 100, as illustrated. In an advantageous embodiment, the plating layers 150 illustrated in FIG. 1 are copper, deposited on the substrate 100 using an electro-less plating process. Of course, other suitable materials, as well as deposition techniques, may be used to form the plating layers 150.

Figure 2:
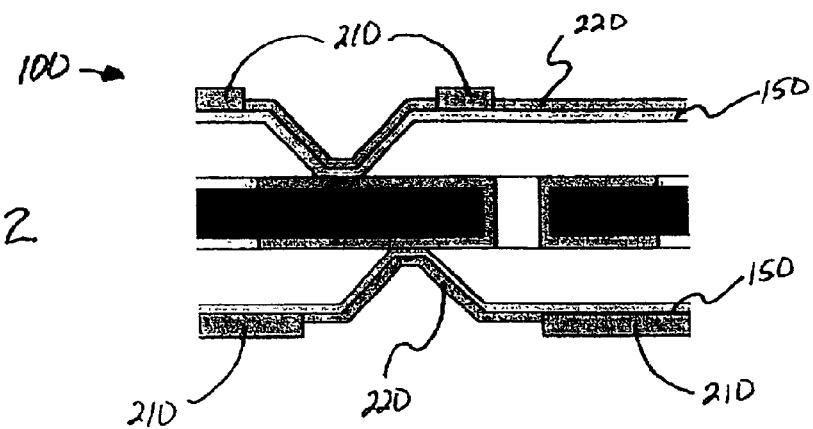
FIG. 2 illustrates a sectional view of a portion of the substrate of FIG. 1 after undergoing an etch resist masking and an electroplating process.

Turning now to FIG. 2, illustrated is a sectional view of a portion of one embodiment of the substrate 100 of FIG. 1 after undergoing an etch resist masking and an electroplating process. Specifically, a mask 210, such as an etch resist, is deposited on the plating layers 150 on opposing sides of the dielectric layer 140 and patterned.

A conductive layer 220 is then formed over the unmasked portions of the plating layers 150. In an advantageous embodiment, the conductive layer 220 is formed on the plating layers 150 using an electroplating process and are deposited to a thickness that is significantly greater than the thickness of the plating layers 150. For example, the conductive layer 220 may have a thickness of about 0.015 mm, while the thickness of the plating layer 150 may have a thickness of about 0.0015 mm. In an advantageous embodiment, this thickness differential is taken advantage of in subsequent etching processes. Of course, other deposition processes and thickness are within the scope of the present invention. In a related embodiment, the conductive layer 220 may also be formed from copper, however other conductive materials are also within the scope of the present invention. By applying the conductive layer 220 over the mask 210, a discontinuous conductive layer 220 is formed on the dielectric layer 140.

Figure 3:
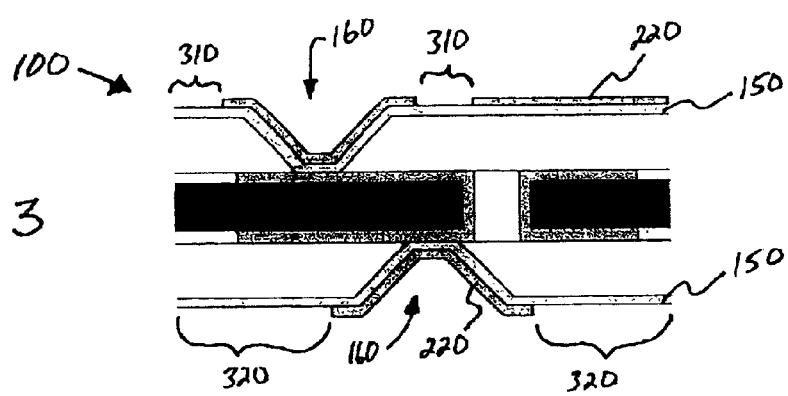
FIG. 3 illustrates a sectional view of a portion of the substrate after undergoing the removal of the etch resist.

Looking now at FIG. 3, illustrated is a sectional view of a portion of one embodiment of the substrate 100 after undergoing removal of the etch resist. As illustrated, the mask 210 is removed from both of the opposing sides of the substrate 100. Once the mask 210 has been removed, the discontinuity of the conductive layer 220 is evidenced by upper openings 310 on the first side, and lower openings 320 on the second side, of the substrate 100. While not shown, it should be easily understood that the length of the conductive layer 220 on the second side, as illustrated, of the substrate 100 is substantially confined to the opening 145. However, on both sides of the substrate 100, the openings 310, 320 reveal the plating layers 150 located beneath the conductive layer 220.

Figure 4:
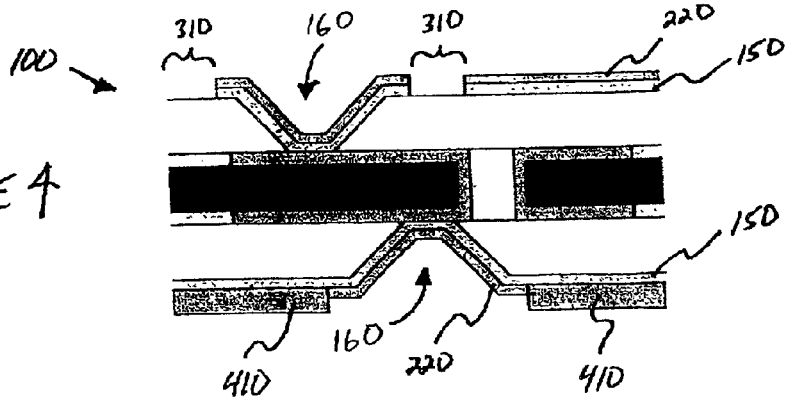
FIG. 4 illustrates a sectional view of a portion of the substrate after an etch resist has been applied to the bottom side of the substrate.

Referring now to FIG. 4, illustrated is a sectional view of a portion of one embodiment of the substrate 100 after an etch resist 410 has been applied to the bottom side of the substrate 100. As shown in FIG. 4, the etch resist 410 is applied in the lower openings 320 of the substrate 100 to protect the plating layer 150 on the second side of the substrate 100. An etchant is applied to the substrate 100 to perform a quick etch to remove the portions of the electro-less plating layers 150 exposed through the upper openings 310 and not protected by the etch resist 410. While the conductive layers 220 are exposed to the etch, the etch rate is slow enough such that the thinner plating layer 150 is removed while the thicker conductive layer 220 remains. The etch resist 410 prevents the previously exposed plating layer 150 on the second side from being etched away, thus allowing the plating layers 150 to maintain an electrical connection across the second side of the substrate 100, and to portions of the first side through the metal interconnect 130 and via 120.

Once portions of the plating layers 150 have been etched from the first side, some of the remaining portions of the plating layers 150 and the conductive layer 220 form the contact pad recess 160 on the first side of the substrate 100 that is electrically disconnected from other portions of layers on the first side. Although now discontinuous, the portions of the plating layers 150 and conductive layer 220 forming the contact recesses 160 may still receive electrical current from the still-in-tact plating layer 150 on the second side of the substrate 100 through the via 120 and metal interconnect 130. Of course, portions of the plating layer 150 and conductive layer 220 need not be etched away from the first side of the substrate 100 to fall within the broad scope of the present invention. However, should such a discontinuous layout be desired, the etch resist 410 allows the plating layer 150 on the second side to provide electrical current through the metal interconnect 130 and vias 120 to contact recesses 160 located on the first side.

Figure 5:
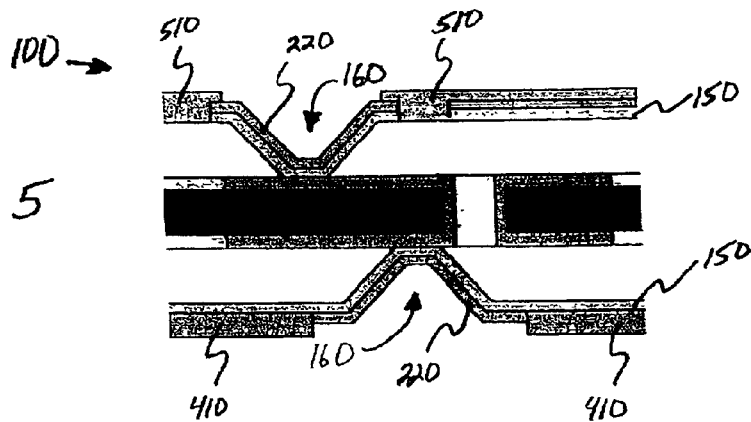
FIG. 5 illustrates a sectional view of a portion of the substrate after a solder mask has been applied to the top side of the substrate.

Turning briefly to FIG. 5, illustrated is a sectional view of a portion of one embodiment of the substrate 100 after a solder mask 510 has been applied to the top side of the substrate 100. As illustrated, the solder mask 510 is used to fill in the upper openings 310, as well as cover those portions of the plating layer 150 and the conductive layer 220 not forming the contact recesses 160. Those skilled in the art will realize the deposition of the solder mask 510 as a conventional process.

Figure 6:
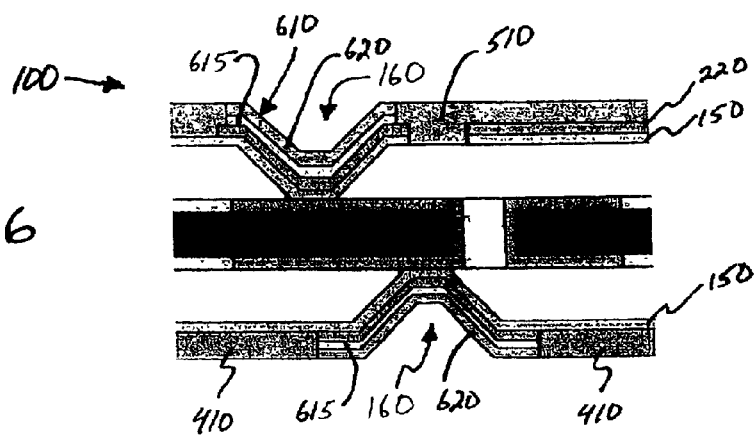
FIG. 6 illustrates a sectional view of a portion of the substrate after undergoing a gold/nickel electroplating process.

Looking now at FIG. 6, illustrated is a sectional view of a portion of one embodiment of the substrate 100 after undergoing a gold/nickel electroplating process. Specifically, a contact pad 610 is plated over the remaining exposed portions of the conductive layer 220 to finish the contact recesses 160. In an advantageous embodiment, the contact 610 includes a barrier layer 615, such as nickel and a contact layer 620, such as gold. In such an embodiment, the nickel would serve as a barrier between a copper conductive layer 220 and the gold contact layer 620 to prevent the copper from reacting with the gold. Of course, in other embodiments, other materials may also be employed as the various layers 220, 615, 620 of the contact pad 610, perhaps even eliminating the need for the barrier layer 615.

By protecting the plating layer 150 on the second side of the substrate 100 during the etch performed earlier, the plating layer 150 on the second side remains in tact to provide a path for the electric current necessary for electroplating the barrier and contact layers 615, 620. In fact, although the plating layer 150 and the conductive layer 220 on the first side of the PWB 110 have been made discontinuous with respect to the remaining portions of layers on that side, the plating layer 150 on the second side may still provide the desired electrical current through the vias 120 and metal interconnect 130. Those skilled in the art understand the advantages of electroplating the layers 615, 620 forming the contact pads 610, as discussed above, and the solid foundation electroplated contact pads 610 provide for ICs mounted on the substrate 100.

Figure 7:
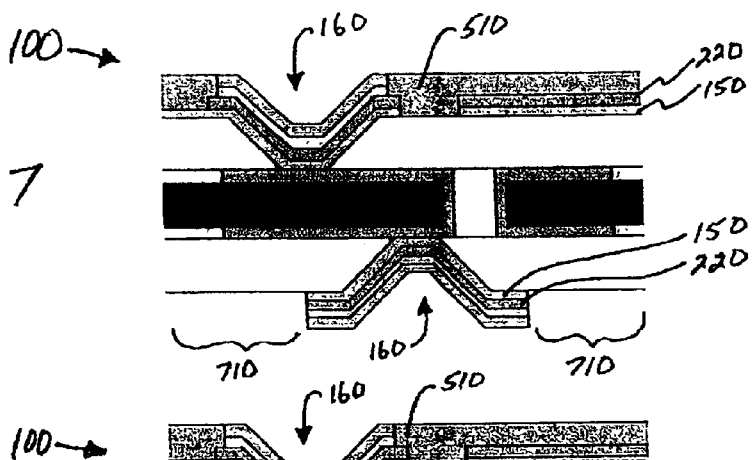
FIG. 7 illustrates a sectional view of a portion of the substrate after undergoing the removal of the etch resist from the bottom side.

Now referring to FIG. 7, illustrated is a sectional view of a portion of one embodiment of the substrate 100 after undergoing the removal of the etch resist 410 from the bottom side. By removing the etch resist 410, the portions of the conductive and plating layers 220, 150 on the second side that are not part of the contact pads 610 are removed from the substrate 100 leaving new lower openings 710. In an advantageous embodiment, the etchant employed is one that will not readily etch the solder mask 510 or the contact layer 620 so as to protect those portions of the substrate 100. By etching the plating layer 150 from the second side of the substrate 100, the "tie bar" (e.g., the plating layers 150) used to carry the electrical current necessary for electroplating the barrier and contact layers 615, 620 has been substantially removed from the substrate 100, along with the detrimental effects associated therewith; that is, the plating layer's 150 length no longer extends to the outer edge of the substrate 100. Alternatively, the length of the plating layer 150 may be substantially confined to the openings 145 as shown in the various figures. However, it should be specifically understood that the final length of the plating layer 150 may vary, as long as the length is kept to a length that avoids the problems associated with the conventional processes and structures discussed above. Thus, the present invention provides the advantages of both a structure and process that fully utilizes the benefits associated with a tie bar or plating layer and an electroplating processes associated therewith, but because a substantial portion of the plating layer 150 is ultimately removed, the problems associated with the conventional processes as discussed above are avoided.

Figure 8:
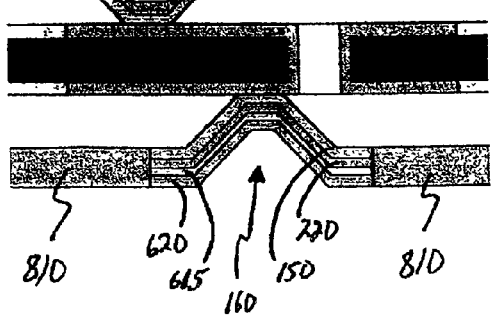
FIG. 8 illustrates a sectional view of the portion of the substrate being finished by applying another solder mask to the bottom side.

Turning finally to FIG. 8, illustrated is a sectional view of a portion of one embodiment of the substrate 100 being finished by applying a lower solder mask 810 to the bottom side. As shown, the lower solder mask 810 is used to fill the prior openings 710 after the second etch was performed. The lower solder mask 810 helps protect the surfaces of the substrate 100 not used as contact pads 610 and completes production of the substrate 100. Although particular steps have been described with references to FIGS. 1–8, other embodiments of the present invention may have additional or fewer steps than those described herein.

By providing a substrate having electroplated contact layers, but without a substantial portion of the plating bars in the final product, the present invention provides several benefits over the prior art. For instance, the present invention provides the quality and strength available from electroplated contact layers without the interference caused by plating bars left in the final product. Those skilled in the art understand the electrical noise and interference that may be caused by plating bars left within the substrate. In addition, the present invention provides for a more efficient use of surface area within a substrate. Where plating bars may be found on almost every layer in finished prior art substrates using electroplated contact layers, substrates constructed according to the principles of the present invention have that space available for other uses, such as increasing the circuit density of the substrate. Alternatively, that previously wasted space may simply be used to condense the overall size of the substrate. Understandably, manufacturers may be eager to shrink the size of their substrates for use in today's ever-decreasing device sizes. This technique, in accordance with the present invention, is also employable with a variety of IC mounting techniques, either now existing or later developed, such as wirebond and chip-flip techniques. Furthermore, the electroplating technique of the present invention is employable multiple times in the manufacture of various substrates, while each time retaining benefits such as those described herein.

Figure 9:
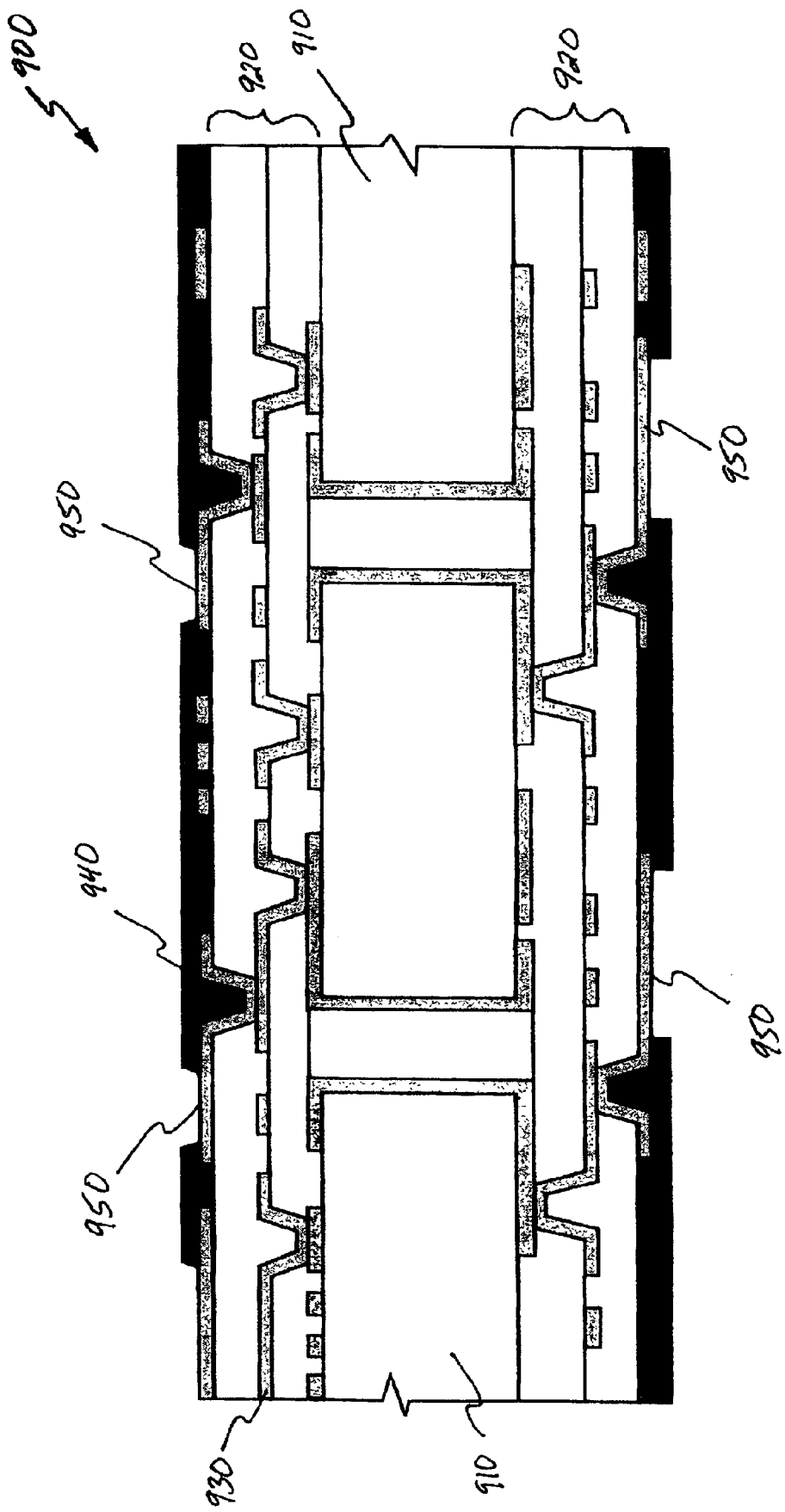
FIG. 9 illustrates a sectional view of a portion of an IC substrate having multiple layers manufactured according to the principles of the present invention.

Turning finally to FIG. 9, illustrated is a sectional view of a portion of an IC substrate 900 having multiple layers manufactured according to the principles of the present invention. As with other embodiments, the substrate 900 includes a PWB core 910 on which various layers may be formed. Also illustrated are multiple dielectric layers 920 having conductive layers 930 formed therein. In accordance with the present invention, the conductive layers 930 are formed to provide electrical interconnections throughout portions of the layers of the substrate 900, as well as from one side of the substrate 900 to the other. The substrate 900 also includes solder masks 940 formed on the outer surfaces, in accordance with conventional practice. In addition, contact pads 950 are also formed on the outer surfaces of the substrate 900 to provide a foundation for mounting desired components. As shown in FIG. 9, the present invention provides for the formation of contact pads 950 laterally offset from the contact recesses described in detail above. Of course, a substrate manufactured according to the present invention is not limited to either embodiment of contact pad.

Although the present invention has been described in detail, those skilled in the art should understand that they can make various changes, substitutions and alterations herein without departing from the spirit and scope of the invention in its broadest form.

What is claimed is:

1. A method of plating an electrical contact on a substrate, comprising:
    forming a metal interconnect on first and second opposing sides of a substrate and through a via formed through the substrate;
    forming first and second dielectric layers on the metal interconnect and over the first and second sides of the substrate, respectively, wherein the first and second dielectric layers each have openings therethrough that expose portions of the metal interconnect;
    forming first and second plating layers on the first and second dielectric layers, respectively, and on the sides of the openings and on the exposed portions of the metal interconnect, the first and second plating layers electrically connected by the metal interconnect, wherein forming the first plating layer includes forming a discontinuous first plating layer;
    electroplating first and second contact layers over a respective portion of each of the first and second plating layers using the first and second plating layers; and
    removing a portion of each of the first and second plating layers from the first and second dielectric layers while leaving the portions of the first and second plating layers under the first and second contact layers.

2. The method as recited in claim 1 wherein forming first and second plating layers includes forming the first and second plating layers with an electro-less process and the method further includes electroplating first and second conductive layers on the first and second plating layers, respectively.

3. The method as recited in claim 1 wherein electroplating first and second contact layers includes electroplating first and second barrier layers over the first and second plating layers, respectively.

4. The method as recited in claim 3 wherein electroplating first and second barrier layers includes electroplating first and second nickel layers, respectively, and electroplating first and second contact layers further includes electroplating first and second gold layers on the first and second nickel layers, respectively.

5. The method as recited in claim 1 wherein removing a portion of each of the first and second plating layers includes removing a portion of the first plating layer prior to electroplating the first and second contact layers.

6. The method as recited in claim 1 wherein removing a portion of each of the first and second plating layers includes removing a portion of the second plating layer subsequent to electroplating the first and second contact layers.

7. The method as recited in claim 1 wherein the first and second plating layers are not formed in the via.

8. The method as recited in claim 2 wherein the electroplating first and second conductive layers includes electroplating first and second conductive layers each substantially confined to the openings.

9. A method of manufacturing an integrated circuit (IC) substrate, comprising:
    forming a multi-layered substrate with a printed wiring board core and having vias formed therethrough;
    forming metal interconnects on first and second opposing sides of the printed wiring board and through the vias;
    forming first and second dielectric layers on the metal interconnects over the first and second sides of the printed wiring board, respectively, the first and second dielectric layers each having openings therethrough that expose portions of the metal interconnects; and
    plating an electrical contact on the substrate, including:
        forming first and second plating layers on the first and second dielectric layers, respectively, and on the sides of the openings and on the exposed portions of the metal interconnects, the first and second plating layers electrically connected by one of the metal interconnects, wherein forming the first plating layer includes forming a discontinuous first plating layer;
        electroplating first and second contact layers over a respective portion of each of the first and second plating layers using the first and second plating layers; and
        removing a portion of each of the first and second plating layers from the first and second dielectric layers while leaving the portions of the first and second plating layers under the first and second contact layers.

10. The method as recited in claim 9 wherein forming the first and second plating layers includes forming the first and second plating layers with an electro-less process and the method further includes electroplating first and second conductive layers on the first and second plating layers, respectively.

11. The method as recited in claim 9 wherein electroplating first and second contact layers includes electroplating first and second barrier layers over the first and second plating layers, respectively.

12. The method as recited in claim 11 wherein electroplating first and second barrier layers includes electroplating first and second nickel layers and electroplating first and second contact layers further includes electroplating first and second gold layers on the first and second nickel layers.

13. The method as recited in claim 9 wherein removing a portion of each of the first and second plating layers includes removing a portion of the first plating layer prior to electroplating the first and second contact layers.

14. The method as recited in claim 9 wherein removing a portion of each of the first and second plating layers includes removing a portion of the second plating layer subsequent to electroplating the first and second contact layers.

15. The method as recited in claim 9 wherein the first and second plating layers are not formed in the vias.

16. The method as recited in claim 10 wherein the electroplating first and second conductive layers includes electroplating first and second conductive layers each substantially confined to the openings.

* * * * *